United States Patent
Ono et al.

(10) Patent No.: US 9,137,471 B2
(45) Date of Patent: Sep. 15, 2015

(54) SOLID-STATE IMAGE SENSOR

(71) Applicant: CANON KABUSHIKI KAISHA, Tokyo (JP)

(72) Inventors: Toshiaki Ono, Ebina (JP); Yukio Araoka, Hiratsuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/301,552

(22) Filed: Jun. 11, 2014

(65) Prior Publication Data
US 2014/0375859 A1 Dec. 25, 2014

(30) Foreign Application Priority Data

Jun. 20, 2013 (JP) ................................. 2013-130002

(51) Int. Cl.
*H04N 5/378* (2011.01)
*H01L 27/146* (2006.01)

(52) U.S. Cl.
CPC .......... *H04N 5/378* (2013.01); *H01L 27/14601* (2013.01)

(58) Field of Classification Search
CPC ................. H04N 5/378; H04N 3/1575; H01L 27/14603; H01L 27/14609; H01L 27/14643; H01L 27/14601
USPC .......... 348/302, 315; 257/291, 292; 250/208.1
See application file for complete search history.

(56) References Cited

U.S. PATENT DOCUMENTS

| | | | |
|---|---|---|---|
| 5,274,476 A | * | 12/1993 | Lee ............................... 348/319 |
| 6,906,332 B2 | | 6/2005 | Tashiro et al. |
| 7,564,037 B2 | | 7/2009 | Tashiro et al. |
| 7,787,037 B2 | | 8/2010 | Ono et al. |
| 7,817,199 B2 | | 10/2010 | Yamashita et al. |
| 7,842,927 B2 | | 11/2010 | Tashiro et al. |
| 7,847,259 B2 | | 12/2010 | Tashiro et al. |
| 7,952,077 B2 | | 5/2011 | Tashiro et al. |
| 7,986,353 B2 | | 7/2011 | Ono |

(Continued)

FOREIGN PATENT DOCUMENTS

| | | |
|---|---|---|
| JP | 2002-050752 A | 2/2002 |
| JP | 2003-078827 A | 3/2003 |

(Continued)

OTHER PUBLICATIONS

Kentaro Tsukida, et al., U.S. Appl. No. 14/300,536, filed Jun. 10, 2014.
Yukio Araoka, U.S. Appl. No. 14/314,141, filed Jun. 25, 2014.
Hideaki Takada, et al., U.S. Appl. No. 14/470,141, filed Aug. 27, 2014.

*Primary Examiner* — Nhan T Tran
(74) *Attorney, Agent, or Firm* — Fitzpatrick, Cella, Harper & Scinto

(57) ABSTRACT

Each of pixels in a pixel array includes a photoelectric converter and a readout circuit which outputs a signal in accordance with charges generated in the photoelectric converter. The readout circuit includes a group of transistors which are disposed so as to form a current path fed by a current source. The readout circuit of a pixel in a first line in the array and the readout circuit of a pixel in a second line in the array are disposed between the photoelectric converter of the pixel in the first line and the photoelectric converter of the pixel in the second line. Directions of currents respectively flowing through the group of transistors in the readout circuit of the pixel in the first line and the plurality of transistors in the readout circuit of the pixel in the second line are the same.

10 Claims, 6 Drawing Sheets

(56) References Cited

U.S. PATENT DOCUMENTS

| | | |
|---|---|---|
| 8,085,319 B2 | 12/2011 | Ono et al. |
| 8,670,049 B2 | 3/2014 | Ono et al. |
| 8,675,107 B2 | 3/2014 | Yamashita et al. |
| 8,810,705 B2 | 8/2014 | Ono |
| 8,913,168 B2 * | 12/2014 | Matsuda et al. ............. 348/302 |
| 2011/0176045 A1 * | 7/2011 | Ahn et al. .................... 348/308 |
| 2012/0008029 A1 * | 1/2012 | Matsuda et al. ........... 250/208.1 |
| 2013/0176468 A1 | 7/2013 | Ono |
| 2013/0181115 A1 | 7/2013 | Ono |
| 2013/0182157 A1 | 7/2013 | Ono |
| 2013/0182163 A1 | 7/2013 | Kobayashi et al. |
| 2014/0197302 A1 | 7/2014 | Araoka et al. |

FOREIGN PATENT DOCUMENTS

| | | |
|---|---|---|
| JP | 2010-258082 A | 11/2010 |
| JP | 2012-019057 A | 1/2012 |

\* cited by examiner

SOLID-STATE IMAGE SENSOR

BACKGROUND OF THE INVENTION

1. Field of the Invention

The present invention relates to a solid-state image sensor.

2. Description of the Related Art

Japanese Patent Laid-Open No. 2012-019057 describes the relative disposition of a photoelectric converter and a readout circuit in a solid-state image sensor which forms one imaging area by arranging a plurality of imaging blocks. FIG. 2 of Japanese Patent Laid-Open No. 2012-019057 describes an arrangement in which pixels in an odd numbered column and pixels in an even numbered column have a line-symmetric layout with respect to a symmetric axis between the odd numbered column and the even numbered column.

FIG. 1 shows an example in which two adjacent pixels are line-symmetrically disposed with respect to a line along a column direction as a symmetric axis. Each pixel complies with the layout of one pixel described in FIG. 6 of Japanese Patent Laid-Open No. 2012-019057. A current flows from a node n1 to GND through a transistor 303 connected to a photoelectric converter 202 via a node CVC and a transistor 304 to which an EN signal is connected. This current flows from left to right in the left-side pixel, and from right to left in the right-side pixel.

Generally, a process for forming a transistor includes an ion implantation step. There are, for example, ion implantation for forming a well, ion implantation for forming a source/drain region, ion implantation for adjusting a threshold, and the like. At that time, in order to prevent a channeling phenomenon, ion implantation (to be referred to as oblique ion implantation) can be performed without implanting ions in parallel to a normal on a semiconductor substrate surface in a direction with an inclination of about 7° with respect to the normal.

When oblique ion implantation is performed in the layout as shown in FIG. 1, since the current flowing direction in the left-side pixel differs from that in the right-side pixel, the relationship between an ion implantation angle and the current direction in the left-side pixel differs from that in the right-side pixel. Then, a voltage-current characteristic of the transistor slightly shifts between the left-side pixel and the right-side pixel, and a pixel output shifts between an odd numbered column and an even numbered column. This generates fixed-pattern noise.

SUMMARY OF THE INVENTION

Embodiments of the present invention provide a technique for advantageously reducing fixed-pattern noise.

The present invention in its first aspect provides a solid-state image sensor comprising a pixel array in which a plurality of pixels are arranged so as to form a plurality of lines along a first direction and a plurality of lines along a second direction crossing the first direction, wherein each of the plurality of pixels includes a photoelectric converter and a readout circuit configured to output a signal in accordance with charges generated in the photoelectric converter to a signal line, the readout circuit includes a group of transistors which are disposed so as to form a current path fed by a current source, the plurality of lines along the first direction includes a first line and a second line which are adjacent to each other, the readout circuit of a pixel in the first line and the readout circuit of a pixel in the second line are disposed between the photoelectric converter of the pixel in the first line and the photoelectric converter of the pixel in the second line, and directions of currents respectively flowing through the group of transistors in the readout circuit of the pixel in the first line and the plurality of transistors in the readout circuit of the pixel in the second line are the same.

The present invention in its second aspect provides a solid-state image sensor comprising a pixel array in which a plurality of pixels are arranged so as to form a plurality of lines along a first direction and a plurality of lines along a second direction crossing the first direction, wherein each of the plurality of pixels includes a photoelectric converter and a readout circuit configured to output a signal in accordance with charges generated in the photoelectric converter to a signal line, the readout circuit includes a first transistor configured to form a current source and a plurality of second transistors which are disposed so as to form a current path together with the current source, the plurality of lines along the first direction includes a first line and a second line which are adjacent to each other, the readout circuit of a pixel in the first line and the readout circuit of a pixel in the second line are disposed between the photoelectric converter of the pixel in the first line and the photoelectric converter of the pixel in the second line, and directions of currents respectively flowing through the first transistor and the plurality of second transistors of the pixel in the first line, and the first transistor and the plurality of second transistors of the pixel in the second line are the same.

Further features of the present invention will become apparent from the following description of exemplary embodiments (with reference to the attached drawings).

DESCRIPTION OF THE EMBODIMENTS

Figure 1:
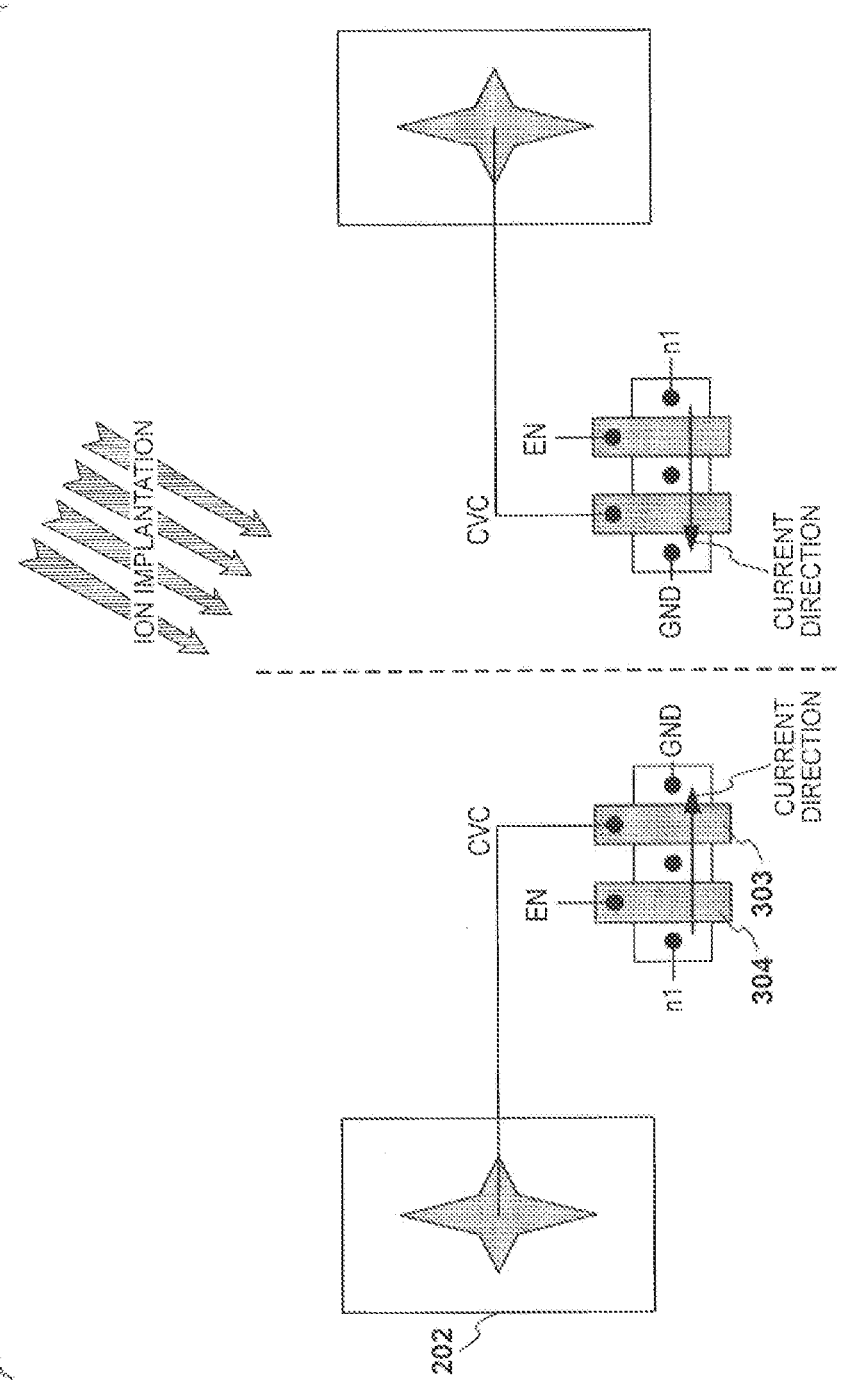
FIG. 1 is a layout diagram for explaining a technical problem.
Figure 2A:
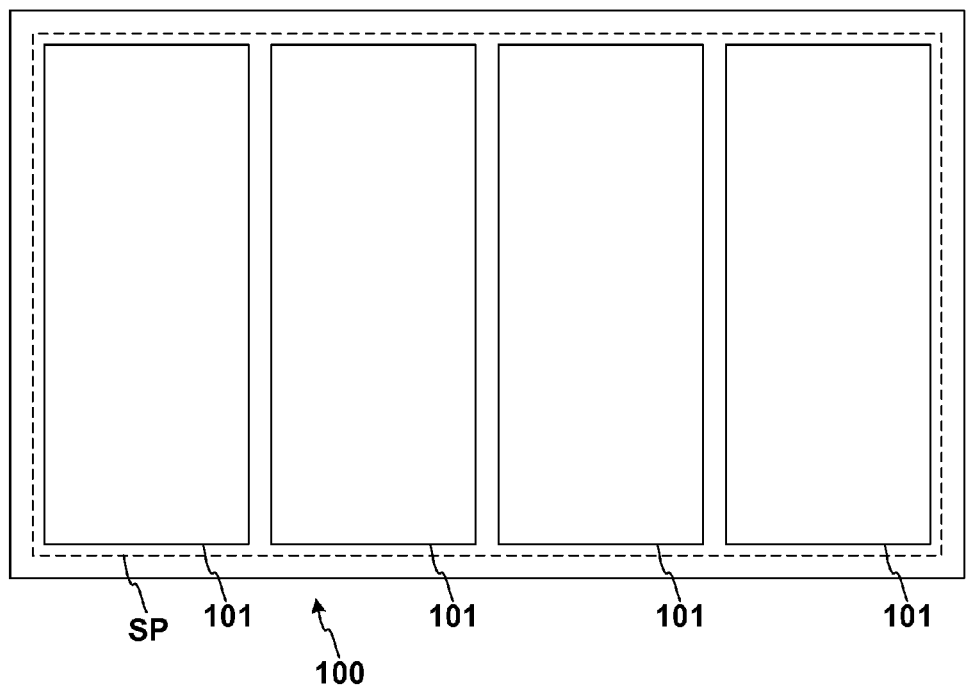
FIGS. 2A and 2B illustrates an example of the arrangement of a solid-state image sensor.
Figure 2B:
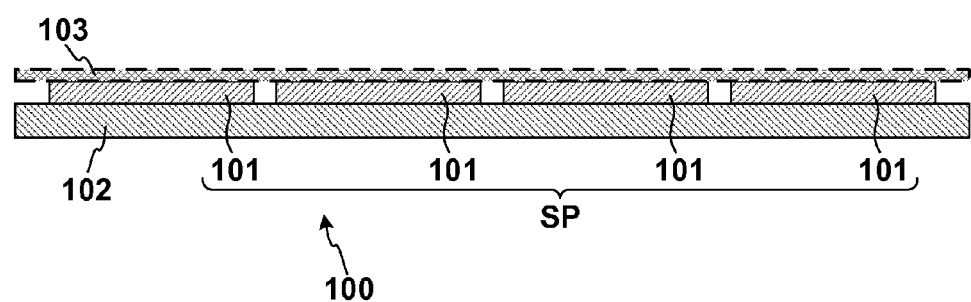

The schematic arrangement of a solid-state image sensor 100 as one embodiment of the present invention will be described with reference to FIGS. 2A and 2B. FIG. 2A is a plan view of the solid-state image sensor 100 and FIG. 2B is a sectional view of the solid-state image sensor 100. The solid-state image sensor 100 can be formed, for example, by arranging a plurality of imaging blocks 101. In this case, a sensor panel SP including one imaging area can be formed by arranging the plurality of imaging blocks 101. The plurality of imaging blocks 101 can be disposed on a support substrate 102. When the solid-state image sensor 100 is formed by one imaging block 101, the sensor panel SP is formed by this imaging block 101. Each of the plurality of imaging blocks 101 may be, for example, a block in which a circuit element is formed on a semiconductor substrate, or a block in which a semiconductor layer is formed on such as a glass substrate and the circuit element is formed on this semiconductor layer. Each of the plurality of imaging blocks 101 includes a pixel array in which a plurality of pixels are arranged so as to form a plurality of rows and columns.

The solid-state image sensor 100 may be formed as, for example, a sensor which senses an image of radiation such as X-rays, or a sensor which senses an image of visible light. When the solid-state image sensor 100 is formed as the sensor which senses the image of radiation, a scintillator 103 which converts radiation to visible light can typically be provided on the sensor panel SP. The scintillator 103 converts radiation to visible light. This visible light enters the sensor panel SP and undergoes photoelectric conversion by each photoelectric converter of the sensor panel SP (imaging block 101).

Figure 3:
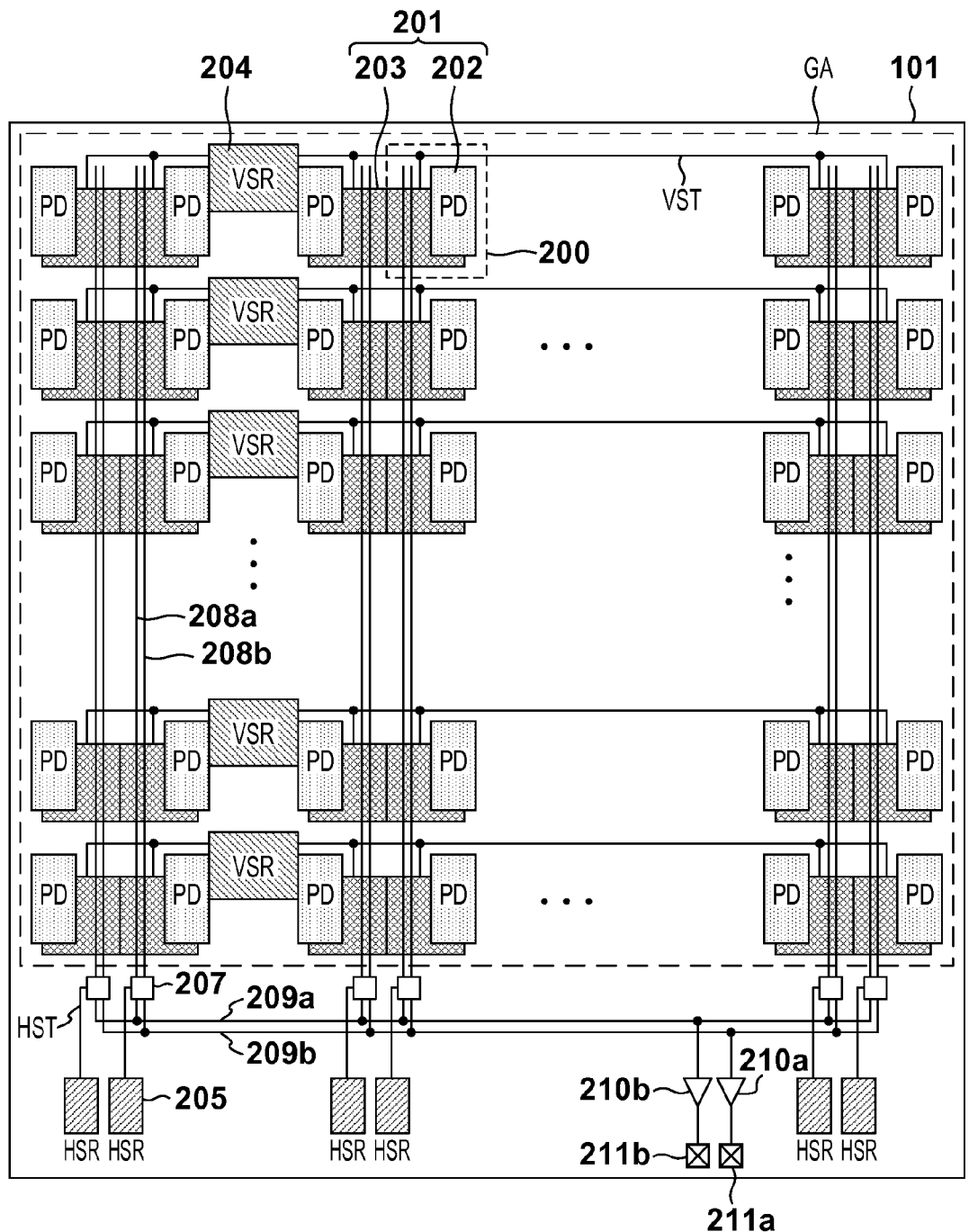
FIG. 3 illustrates an example of the arrangement of an imaging block.

An example of the arrangement of each of the imaging blocks 101 will now be described with reference to FIG. 3. Note that when the solid-state image sensor 100 is formed by one imaging block 101, this imaging block 101 can be considered as the solid-state image sensor. The imaging block 101 includes a pixel array GA in which a plurality of pixels 201 are arranged so as to form a plurality of rows and columns, and a plurality of column signal lines 208a are disposed. If both of each row and column are defined as "lines", the imaging block 101 includes the pixel array in which a plurality of pixels are arranged so as to form a plurality of lines along the first direction and a plurality of lines along the second direction which crosses the first direction. The two lines which are adjacent to each other can be referred to as the first line and the second line for the sake of convenience in order to distinguish them from each other. A plurality of lines along the first direction include, for example, the first and second lines which are adjacent to each other.

Each of the plurality of pixels 201 includes a photoelectric converter (for example, a photodiode) 202 and a readout circuit 203 configured to output a signal (optical signal) in accordance with charges generated in the photoelectric converter 202 to the column signal line 208a. A plurality of column signal lines 208b may also be disposed in the pixel array GA. The readout circuit 203 can be formed to output noise of the readout circuit 203 to each of the column signal lines 208b. At least a part of the readout circuit 203 in each of the two pixels 201 which are adjacent along the row direction is arrayed in the area sandwiched by the two photoelectric converters 202 of the two adjacent pixels 201. The readout circuit 203 in each of the two pixels 201 which are adjacent along the row direction can, for example, be line-symmetrically disposed with respect to a boundary line of the two pixels 201 as a symmetric axis. One of the two pixels 201 which are adjacent along the row direction is included in an odd numbered column; and the other, in an even numbered column.

Each vertical scanning circuit 204 includes, for example, a vertical shift register which performs a shift operation in response to the first clock, and scans (selects) a plurality of rows in the pixel array GA in accordance with the shift operation by the vertical shift register. The vertical shift register is formed by series-connecting a plurality of registers. A pulse received by the first register is sequentially transferred to the next register in response to a first clock. The row corresponding to the register which holds a pulse is a row to be selected.

Each horizontal scanning circuit 205 can, for example, be disposed outside the photoelectric converter 202 in the outermost row in the pixel array GA, but may be disposed between the photoelectric converters 202 in the two adjacent rows. Each of the horizontal scanning circuits 205 includes, for example, a horizontal shift register which performs the shift operation in response to the second clock, and scans (selects) a plurality of columns in the pixel array GA in accordance with the shift operation by the horizontal shift register. The horizontal shift register is formed by series-connecting a plurality of registers. A pulse taken in by the first register is sequentially transferred to the next register in response to a second clock. The column corresponding to the register which holds a pulse is a column to be selected.

Each of the vertical scanning circuits 204 can be formed by arranging a plurality of unit vertical scanning circuits VSR each including one register for forming the vertical shift register in the vertical direction. Each of the unit vertical scanning circuits VSR can be disposed in the area sandwiched by the photoelectric converter 202 of the pixel belonging to a certain column (the second column from the left side in FIG. 3) and the photoelectric converter 202 of the pixel belonging to the column which is adjacent to the column (the third column from the left side in FIG. 3). Disposition in this position becomes possible because both of the readout circuits 203 of the two adjacent pixels 201 are disposed in the area sandwiched by the photoelectric converters 202 of the two adjacent pixels 201, that is, an area where there is no readout circuit 203 between the second and the third columns is produced. Furthermore, by adopting such disposition, the photoelectric converter 202 belonging to the leftmost column can be disposed at a position near the left edge of the imaging block 101, and the photoelectric converter 202 belonging to the rightmost column can be disposed at a position near the right edge of the imaging block 101. This makes it possible to reduce the distance between the adjacent photoelectric converters 202 of the imaging block 101 when the solid-state image sensor 100 is formed by arranging the plurality of imaging blocks 101. This contributes to the improvement of resolution. Alternatively, the photoelectric converters 202 can be disposed at equal intervals by this layout even when the plurality of imaging blocks 101 are arranged. This contributes to the improvement of image quality.

When a pulse is transferred through the vertical shift register, each of the unit vertical scanning circuits VSR drives a row selection signal VST to an active level so as to select the pixel 201 in the row to which the pulse belongs. The optical signal and noise of the pixel 201 in the selected row are output to the column signal lines 208a and 208b, respectively.

Each of the horizontal scanning circuits 205 can be formed by arranging a plurality of unit horizontal scanning circuits HSR each including one register for forming the horizontal shift register in the horizontal direction. When a pulse is transferred through the horizontal shift register, each of the unit horizontal scanning circuit HSR controls a switch 207 to select the column to which the pulse belongs, that is, to connect the column signal lines 208a and 208b in the column to horizontal signal lines 209a and 209b. More specifically, the optical signal and noise of the pixel 201 in the selected row are output to the column signal lines 208a and 208b, and the signal in the selected column (that is, the selected column signal lines 208a and 208b) is output to the horizontal signal lines 209a and 209b, thereby implementing XY addressing. The horizontal signal lines 209a and 209b are connected to the inputs of output amplifiers 210a and 210b. The signals output to the horizontal signal lines 209a and 209b are amplified by the output amplifiers 210a and 210b to be output through pads 211a and 211b.

The pixel array GA can be considered as being arranged so that a plurality of unit cells 200 each including the pixel 201 form a plurality of rows and columns. A given unit cell 200 includes at least a part of the unit vertical scanning circuit VSR. In an example shown in FIG. 3, a set of the two unit cells 200 includes one unit vertical scanning circuit VSR. However, one unit cell 200 may include one unit vertical scanning circuit VSR, or the set of three or more unit cells 200 may include one unit vertical scanning circuit VSR.

An example of the arrangement of each of the pixels 201 will be described with reference to FIG. 4. The pixel 201 includes the photoelectric converter 202 and the readout circuit 203, as described above. The photoelectric converter 202 can typically be a photodiode. The readout circuit 203 can include, for example, a first amplification circuit 310, a clamp circuit 320, an optical signal sample and hold circuit 340, a noise sample and hold circuit 360, NMOS transistors 343 and 363 as second amplification circuits, and row selection transistors 344 and 364.

The photoelectric converter 202 includes a charge storage portion. The charge storage portion is connected to the gate of an NMOS transistor (amplification transistor) 303 in the first amplification circuit 310. The source of the NMOS transistor 303 is connected to an NMOS transistor 305 via an NMOS transistor 304. The NMOS transistor 305 is supplied with a gate voltage Vb and operates as a constant current source. The first source-follower circuit is formed by the NMOS transistors 303 and 305. The NMOS transistor 304 is an enable switch which operates the first source-follower circuit when a control voltage Vg supplied to the gate is set to the active level, and interrupts the current from the first source-follower circuit to set to a power saving state when the control voltage Vg is set to an inactive level. In a first source-follower circuit operating state, a current path is formed between a power source node and a ground node by the NMOS transistors 303, 304, and 305. The control voltage Vg can commonly be supplied to all the pixels 201 in the pixel array GA.

The NMOS transistor 304 may be operated as a grounded-gate circuit by setting the control voltage Vg to an appropriate value. In this case, the NMOS transistor 304 operates as a constant current source of a cascode configuration by the NMOS transistors 304 and 305. The first amplification circuit 310 outputs a signal corresponding to the potential of a charge-voltage converter CVC to an intermediate node n1.

Figure 4:
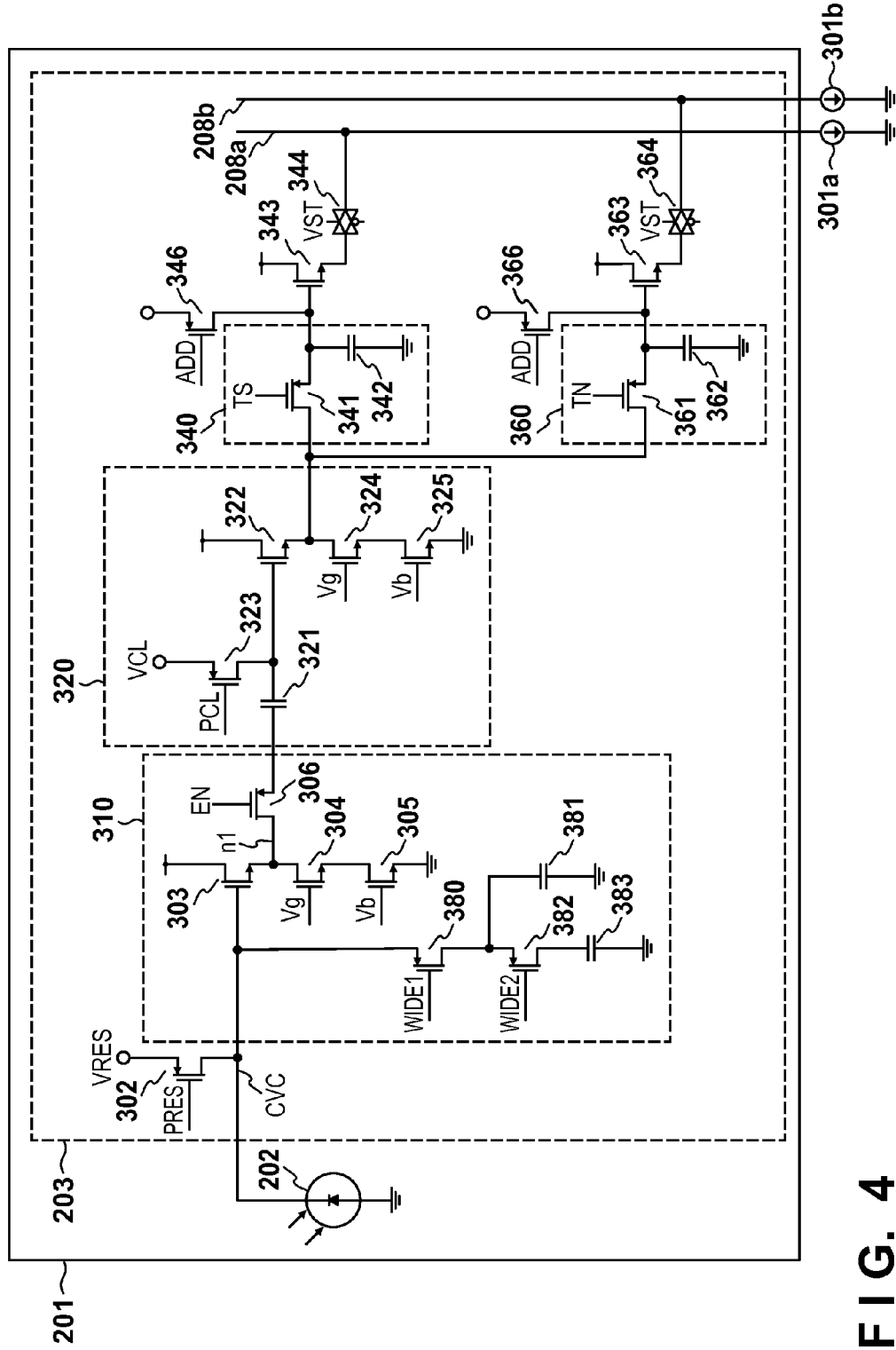
FIG. 4 is a circuit diagram for illustrating an example of the arrangement of a pixel.

In an example shown in FIG. 4, the charge storage portion of the photoelectric converter 202 and the gate of the NMOS transistor 303 form a common node. This node functions as the charge-voltage converter CVC which converts charges stored in the charge storage portion to a voltage. That is, a voltage V (=Q/C) which is determined by charges Q stored in the charge storage portion and a capacitance value C of the charge-voltage converter CVC appears in the charge-voltage converter CVC. The charge-voltage converter CVC is connected to a reset potential Vres via a PMOS transistor 302 serving as a reset switch. When a reset signal PRES is set to the active level, the PMOS transistor 302 is turned on, and the potential of the charge-voltage converter CVC is reset to the reset potential Vres.

The clamp circuit 320 clamps, by a clamp capacitor 321, noise output to the intermediate node n1 by the first amplification circuit 310 in accordance with the reset potential of the charge-voltage converter CVC. Hence, the clamp circuit 320 is a circuit for canceling this noise from the signal output to the intermediate node n1 from the first source-follower circuit in accordance with charges generated by photoelectric conversion in the photoelectric converter 202. Noise output to this intermediate node n1 contains kTC (thermal noise) noise at the time of resetting. The clamp operation is performed by setting, while keeping a PMOS transistor 306 in an on state, a PMOS transistor 323 to an off state after setting it to the on state. The PMOS transistor 306 can be set to the on state by setting an enable signal EN to the active level. Furthermore, the PMOS transistor 323 can be set to the on state by setting a clamp signal PCL to the active level. The output side of the clamp capacitor 321 is connected to the gate of an NMOS transistor (amplification transistor) 322. The source of the NMOS transistor 322 is connected to an NMOS transistor 325 via an NMOS transistor 324. The NMOS transistor 325 is supplied with the gate voltage Vb and operates as the constant current source. The second source-follower circuit is formed by the NMOS transistors 322 and 325. The NMOS transistor 324 is an enable switch which operates the second source-follower circuit when the voltage Vg supplied to the gate is set to the active level, and interrupts the current from the second source-follower circuit to set to a power saving state when the voltage Vg is set to the inactive level. In a second source-follower circuit operating state, a current path is formed between the power source node and the ground node by the NMOS transistors 322, 324, and 325. The control voltage Vg can commonly be supplied to all the pixels 201 in the pixel array GA, as described above.

The NMOS transistor 324 may be operated as the grounded-gate circuit by setting the control voltage Vg to the appropriate value, as described above. In this case, the NMOS transistor 324 operates as a constant current source of a cascode configuration by the NMOS transistors 324 and 325.

The signal output from the second source-follower circuit in accordance with the charges generated by photoelectric conversion in the photoelectric converter 202 is written, as the optical signal, in a capacitor 342 via a switch 341 by setting an optical signal sampling signal TS to the active level. The signal output from the second source-follower circuit when the PMOS transistor 323 is set to the on state immediately after resetting the potential of the charge-voltage converter CVC is noise. This noise is written in a capacitor 362 via a switch 361 by setting a noise sampling signal TN to the active level. This noise contains the offset component of the second source-follower circuit.

When each of the unit vertical scanning circuits VSR of the vertical scanning circuit 204 drives the row selection signal VST to the active level, the signal (optical signal) held in the capacitor 342 is output to the column signal line 208a via the NMOS transistor 343 in the second amplification circuit and the row selection transistor 344. At the same time, the signal (noise) held in the capacitor 362 is output to the column signal line 208b via the NMOS transistor 363 in the second amplification circuit and the row selection transistor 364. The NMOS transistor 343 in the second amplification circuit forms a source-follower circuit together with a constant current source 301a connected to the column signal line 208a. Likewise, the NMOS transistor 363 in the second amplification circuit forms the source-follower circuit together with a constant current source 301b connected to the column signal line 208b.

The pixel 201 may include an adding switch 346 configured to add the optical signals of the plurality of adjacent pixels 201. In an adding mode, an adding mode signal ADD is set to the active level, and the adding switch 346 is set to the on state. By doing so, the capacitors 342 of the adjacent pixels 201 are connected to each other by the adding switch 346 to average the optical signal. Likewise, the pixel 201 may include an adding switch 366 configured to add noise components of the plurality of adjacent pixels 201. When the adding switch 366 is set to the on state, the capacitors 362 of the adjacent pixels 201 are connected to each other by the adding switch 366 to average the noise components.

The pixel 201 may include a function of changing sensitivity. The pixel 201 can include, for example, a first and second sensitivity changing switches 380 and 382, and a circuit element accompanying them. When a first changing signal WIDE 1 is set to the active level, the first sensitivity changing switch 380 is turned on, and the capacitance value of a first additional capacitor 381 is added to the capacitance value of the charge-voltage converter CVC. This reduces the sensitivity of the pixel 201. When a second changing signal WIDE 2 is set to the active level, the second sensitivity changing switch 382 is turned on, and the capacitance value of a second additional capacitor 383 is added to the capacitance value of the charge-voltage converter CVC. This further reduces the sensitivity of the pixel 201. By adding the function to thus reduce the sensitivity of the pixel 201, it is possible to receive a larger amount of light and widen a dynamic range.

The NMOS transistors 303 and 304 are exemplary transistors configured to form the current path together with the NMOS transistor 305 configured to form the constant current source. The NMOS transistors 322 and 324 are exemplary transistors configured to form the current path together with the NMOS transistor 325 configured to form the constant current source. The NMOS transistor 343 and the row selection transistor 344 are exemplary transistors configured to form the current path together with the constant current source 301a. The NMOS transistor 363 and the row selection transistor 364 are exemplary transistors configured to form the current path together with the constant current source 301b. In the example shown in FIG. 4, the current path is formed between the power source node (power source line) and the ground node (ground line). However, the current path may be formed between different potential nodes.

Figure 5:
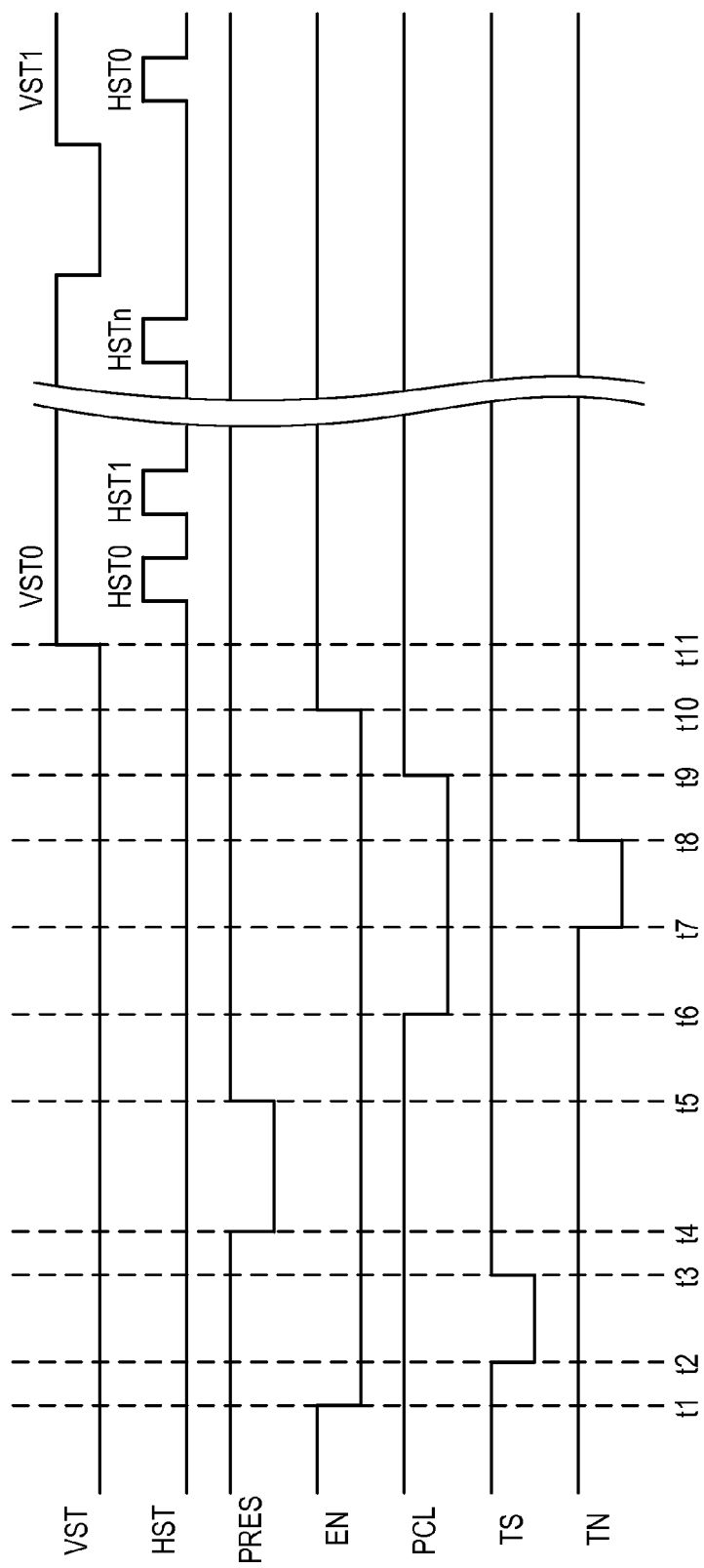
FIG. 5 is a timing chart showing an example of the operation of the solid-state image sensor.

Main signals supplied to each of the pixels 201 will be described with reference to FIG. 5. The reset signal PRES, the enable signal EN, the clamp signal PCL, the optical signal sampling signal TS, and the noise sampling signal TN are active low signals. The reset signal PRES, the enable signal EN, the clamp signal PCL, the optical signal sampling signal TS, and the noise sampling signal TN are commonly supplied to all rows of the pixel array GA, thereby implementing a global electronic shutter.

First, the enable signal EN becomes active at time t1. Next, the optical signal sampling signal TS is set to the active level like a pulse during the period between times t2 and t3 to write the optical signal in the capacitor 342. Then, the reset signal PRES is set to the active level like a pulse during the period between times t4 and t5 to reset the potential of the charge-voltage converter CVC. Then, the clamp signal PCL is set to the active level at time t6. In a state in which the clamp signal PCL is at the active level, the noise sampling signal TN is set to the active level like a pulse during the period between times t7 and t8 to write noise in the capacitor 362.

Subsequently, the unit vertical scanning circuit VSR corresponding to the first row of the vertical scanning circuit 204 sets the row selection signal VST (VST0) to the active level. This means that each of the vertical scanning circuits 204 selects the first row of the pixel array GA. In this state, the unit horizontal scanning circuits HSR corresponding to the first to last columns of the horizontal scanning circuits 205 set the column selection signals HST (HST0 to HSTn) to the active level. This means that the each of the horizontal scanning circuits 205 sequentially selects the first to the last columns of the pixel array GA. By doing so, the optical signals and noise of the pixels from the first to the last columns in the first row of the pixel array GA are output from the output amplifiers 210a and 210b. After that, the unit vertical scanning circuit VSR corresponding to the second row of the vertical scanning circuit 204 sets the row selection signal VST (VST1) to the active level. The unit horizontal scanning circuits HSR corresponding to the first to the last columns of the horizontal scanning circuits 205 set the column selection signals HST (HST0 to HSTn) to the active level. By performing such operation up to the last row, one image is output from the pixel array GA.

Figure 6:
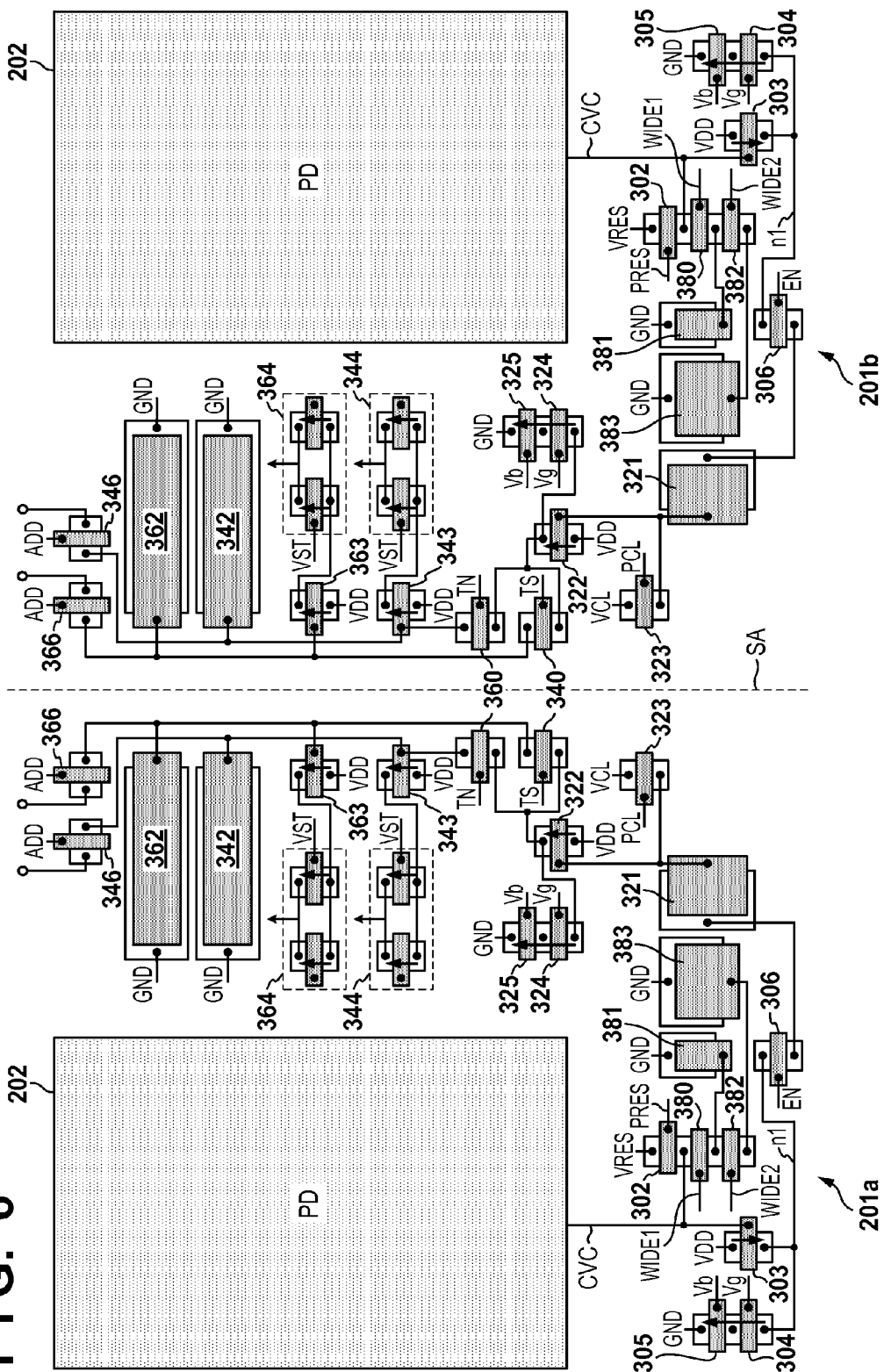
FIG. 6 is a view illustrating an example of the layout of the pixel.

The layout of the pixel 201 will be described with reference to FIG. 6. FIG. 6 shows a pixel 201a in an odd numbered line (odd numbered column) and a pixel 201b in an even numbered line (even numbered column). The pixel 201a in the odd numbered line and the pixel 201b in the even numbered line have the line-symmetric layout with respect to a symmetric axis SA between the odd numbered line and the even numbered line. Moreover, the readout circuit 203 of the pixel 201a and the readout circuit 203 of the pixel 201b are disposed between the photoelectric converter 202 of the pixel 201a and the photoelectric converter 202 of the pixel 201b.

While the first source-follower within the first amplification circuit 310 is operating, a current flows through the NMOS transistors 303 and 305 which form the first source-follower, and the NMOS transistor 304. The current direction is parallel to the symmetric axis SA as the boundary axis between the pixels 201a and 201b. Therefore, the direction of the current flowing through the NMOS transistors 303, 305, and 304 of the pixel 201a and that of the current flowing through the NMOS transistors 303, 305, and 304 of the pixel 201b are the same, that is, parallel to each other. Note that the current directions of the two transistors need not be parallel to the symmetric axis SA so long as they have the same current directions.

Furthermore, while the second source-follower within the clamp circuit 320 is operating, a current flows through the NMOS transistors 322 and 325 which form the second source-follower, and the NMOS transistor 324. The current direction is parallel to the symmetric axis SA as the boundary axis between the pixels 201a and 201b. Therefore, the direction of the current flowing through the NMOS transistors 322, 325, and 324 of the pixel 201a and that of the current flowing through the NMOS transistors 322, 325, and 324 of the pixel 201b are the same, that is, parallel to each other. Note that the current directions of the two transistors need not be parallel to the symmetric axis SA so long as they have the same current directions.

When the row selection signals VST (VST0, VST1 . . . ) are at the active level, a current flows through the NMOS transistor 343 in the second amplification circuit and the row selection transistor 344. Also, when the row selection signals VST (VST0, VST1 . . . ) are at the active level, a current flows through the NMOS transistor 363 in the second amplification circuit and the row selection transistor 364. These current directions are parallel to the symmetric axis SA as the boundary axis between the pixels 201a and 201b. Therefore, the direction of the current flowing through the NMOS transistors 343, 344, 363, and 364 of the pixel 201a and that of the current flowing through the NMOS transistors 343, 344, 363, and 364 of the pixel 201b are the same, that is, parallel to each other. Note that the current directions of the two transistors may not be parallel to the symmetric axis SA as far as they have the same current directions.

As described above, in the first embodiment, the directions of the current flowing through the transistors which form the current path together with a current source during the readout operation are the same in the two adjacent pixels 201a and 201b. Accordingly, in the formation of these transistors, even if oblique ion implantation is performed at any tilting angle, the relationship between the current direction and the ion implantation angle is the same between the pixels 201a and 201b. This makes it possible to reduce the difference in a transistor characteristic (for example, a voltage-current characteristic) between the pixels 201a and 201b, thereby reducing fixed-pattern noise. Note that the tilting angle in oblique ion implantation can be defined as the angle with respect to a normal on a semiconductor substrate surface on which ion implantation is performed.

As for the adding switches 346 and 366, the current flowing direction changes depending on the difference in an output level of a plurality of pixels to which a signal should be added. Therefore, as for the adding switches 346 and 366, the current direction of the pixel 201a and that of the pixel 201b may not be the same. In an example shown in FIG. 6, the direction of the current flowing through the adding switches 346 and 366 crosses the symmetric axis SA. That is, the direction of the current flowing through the adding switches 346 and 366 and that of the current flowing through the transistors which form the current path together with the current source differ from each other. According to this layout, it is possible to efficiently dispose a plurality of transistors included in the readout circuit 203.

In addition to the adding switches 346 and 366, as for the first and the second sensitivity changing switches 380 and 382, the reset switch 302, the PMOS transistor 306, the switches 341 and 361, or the like, the current direction of the pixel 201a and that of the pixel 201b need not be the same. In the example shown in FIG. 6, however, as for the first and the second sensitivity changing switches 380 and 382, the reset switch 302, the PMOS transistor 306, and the switches 341 and 361, the directions of the currents flowing through them are the same between the pixels 201a and 201b. By making the current directions of these transistors uniform, it is possible to further reduce fixed-pattern noise.

In the example described above, the pixels in the odd numbered column and the pixels in the even numbered column have the line-symmetric layout with respect to the symmetric axis between the odd numbered column and the even numbered column, and the readout circuits of the pixels in the odd numbered column and the even numbered column are disposed between the photoelectric converter of the pixel in the odd numbered column and the photoelectric converter of the pixel in the even numbered column. Columns and rows can, however, be transposed. That is, the pixels in the odd numbered row and the pixels in the even numbered row have the line-symmetric layout with respect to the symmetric axis between the odd numbered row and the even numbered row, and the readout circuits of the pixels in the odd numbered row and the even numbered row are disposed between the photoelectric converter of the pixel in the odd numbered row and the photoelectric converter of the pixel in the even numbered row.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-130002, filed Jun. 20, 2013 which is hereby incorporated by reference herein in its entirety.

What is claimed is:

1. A solid-state image sensor comprising a pixel array in which a plurality of pixels are arranged so as to form a plurality of lines along a first direction and a plurality of lines along a second direction crossing the first direction,
    wherein each of the plurality of pixels includes a photoelectric converter and a readout circuit configured to output a signal in accordance with charges generated in the photoelectric converter to a signal line,
    the readout circuit includes a group of transistors which are disposed so as to form a current path fed by a current source,
    the plurality of lines along the first direction includes a first line and a second line which are adjacent to each other,
    the readout circuit of a pixel in the first line and the readout circuit of a pixel in the second line are disposed between the photoelectric converter of the pixel in the first line and the photoelectric converter of the pixel in the second line, and
    directions of currents respectively flowing through the group of transistors in the readout circuit of the pixel in the first line and the group of transistors in the readout circuit of the pixel in the second line are the same.

2. The sensor according to claim 1, wherein the group of transistors include an amplification transistor.

3. The sensor according to claim 1, wherein the readout circuit includes the current source.

4. The sensor according to claim 1, wherein the group of the transistors include a selection transistor configured to select a pixel,
    the selection transistor is formed to output a signal to the signal line, and
    the current source is connected to the signal line.

5. The sensor according to claim 1, further comprising an adding switch configured to add signals of a plurality of pixels,
    wherein the direction of the current flowing through the group of transistors and a direction of a current flowing through the adding switch differ from each other.

6. The sensor according to claim 1, wherein each of the transistors includes an area formed by ion implantation at an angle tilted with respect to a normal on a semiconductor substrate surface.

7. The sensor according to claim 1, wherein the first line and the second line are respectively an odd numbered column and an even numbered column in the pixel array.

8. The sensor according to claim 1, wherein the first line and the second line are respectively an odd numbered row and an even numbered row in the pixel array.

9. The sensor according to claim 1, wherein the pixel in the first line and the pixel in the second line have a line-symmetric layout with respect to a symmetric line in between the first line and the second line.

10. A solid-state image sensor comprising a pixel array in which a plurality of pixels are arranged so as to form a plurality of lines along a first direction and a plurality of lines along a second direction crossing the first direction,
    wherein each of the plurality of pixels includes a photoelectric converter and a readout circuit configured to output a signal in accordance with charges generated in the photoelectric converter to a signal line,
    the readout circuit includes a first transistor configured to form a current source and a plurality of second transistors which are disposed so as to form a current path together with the current source,
    the plurality of lines along the first direction includes a first line and a second line which are adjacent to each other,
    the readout circuit of a pixel in the first line and the readout circuit of a pixel in the second line are disposed between the photoelectric converter of the pixel in the first line and the photoelectric converter of the pixel in the second line, and
    directions of currents respectively flowing through the first transistor and the plurality of second transistors of the pixel in the first line, and the first transistor and the plurality of second transistors of the pixel in the second line are the same.

* * * * *